US007000162B2

(12) United States Patent
Bernstein et al.

(10) Patent No.: US 7,000,162 B2
(45) Date of Patent: Feb. 14, 2006

(54) INTEGRATED CIRCUIT PHASE PARTITIONED POWER DISTRIBUTION FOR STRESS POWER REDUCTION

(75) Inventors: Kerry Bernstein, Underhill, VT (US); Norman J. Rohrer, Underhill, VT (US); Jody J. Van Horn, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 510 days.

(21) Appl. No.: 09/682,233

(22) Filed: Aug. 8, 2001

(65) Prior Publication Data

US 2003/0030460 A1    Feb. 13, 2003

(51) Int. Cl.
  *G01R 31/28*    (2006.01)
  *G06M 3/00*    (2006.01)
  *H03K 19/00*    (2006.01)
(52) U.S. Cl. .................. 714/726; 714/738; 326/16; 377/19
(58) Field of Classification Search ............... 714/726, 714/816, 724, 738; 324/763, 765; 326/724, 326/16; 377/19
  See application file for complete search history.

(56) References Cited

U.S. PATENT DOCUMENTS

| | | | |
|---|---|---|---|
| 4,535,467 A | 8/1985 | Davis et al. .................. 377/81 |
| 4,833,676 A | 5/1989 | Koo ............................ 714/736 |
| 5,375,091 A | 12/1994 | Berry, Jr. et al. ........... 365/201 |
| 5,457,698 A | 10/1995 | Segawa et al. .............. 714/726 |
| 5,488,613 A | 1/1996 | Sridhar ....................... 714/726 |
| 5,619,462 A * | 4/1997 | McClure ..................... 365/201 |
| 5,712,584 A | 1/1998 | McClure ..................... 327/198 |
| 5,742,190 A * | 4/1998 | Banik et al. ................. 327/152 |
| 5,920,575 A | 7/1999 | Gregor et al. .............. 714/726 |
| 5,930,269 A * | 7/1999 | Tsukamoto et al. ......... 714/726 |
| 5,939,914 A | 8/1999 | McClure ..................... 327/198 |
| 6,097,207 A * | 8/2000 | Bernstein et al. .............. 326/9 |
| 6,128,757 A | 10/2000 | Yousuf et al. ............... 714/724 |
| 6,163,172 A | 12/2000 | Bazuin et al. ................ 326/93 |
| 6,181,179 B1 | 1/2001 | Kanba ........................ 327/202 |
| 6,289,477 B1 * | 9/2001 | Gunadisastra ............... 714/724 |
| 6,323,692 B1 * | 11/2001 | Tsinker ........................ 327/12 |
| 6,331,800 B1 * | 12/2001 | Radjassamy ................ 327/566 |
| 6,457,161 B1 * | 9/2002 | Nadeau-Dostie et al. ...... 716/6 |
| 6,636,996 B1 * | 10/2003 | Nowka ....................... 714/727 |

FOREIGN PATENT DOCUMENTS

JP        3238371       10/1991

* cited by examiner

*Primary Examiner*—Albert Decady
*Assistant Examiner*—Esaw Abraham
(74) *Attorney, Agent, or Firm*—Schmeiser, Olsen & Watts; Michael LeStrange

(57) ABSTRACT

Disclosed is an integrated circuit device, comprising: a first power rail for supplying power to first latch and a circuit during a first clock phase; a second power rail for supplying power to a second latch during a second clock phase; and the circuit coupled between an output of the first latch and an input of the second latch.

29 Claims, 7 Drawing Sheets

INTEGRATED CIRCUIT PHASE PARTITIONED POWER DISTRIBUTION FOR STRESS POWER REDUCTION

BACKGROUND OF THE INVENTION

1. Field of the Invention

The present invention relates to the field of integrated circuits; more specifically, it relates to stressing of integrated circuits utilizing level sensitive scan design (LSSD.)

2. Background of the Invention

Stress test modes are commonly used in modern synchronous integrated circuits to subject the integrated circuit to various types of tests that "stress" the circuit and are designed to cause reliability defects to fail during stress rather than later, in the field. One common stress type is called burn-in. During burn-in, the integrated circuit is subjected to high temperatures and higher than normal operational voltages in an effort to cause early drop out of the reliability defects.

LSSD is a method of testing integrated circuits wherein scan latches are placed between logic circuits. The scan latches allow a test vector to be sequenced through the logic circuits so the output vector can be compared to an expected vector to determine if there has been a fail in any of the logic circuits. During stress testing, all the scan latches and logic circuits are powered. For very large and high-speed integrated circuit dies at the leading edge of device technology (i.e. advanced transistor design), sub threshold leakage currents have become significant. In many cases, the stress standby current for a test like burn-in can exceed the current capability of the stress tester. Currents in excess of 75 amperes are routinely encountered. One alternative is to build higher current stress testers, but this is a very expensive solution, and earlier generations of stress testers would become obsolete.

A more desirable solution would be to reduce the standby current draw of the integrated circuit during stress.

Thus, there is an unmet need in the art for a high speed, leading edge technology integrated circuit design that requires lower standby current during stress test.

BRIEF DESCRIPTION OF THE SEVERAL VIEWS OF THE DRAWINGS

BRIEF DESCRIPTION OF DRAWINGS

Figure 1:
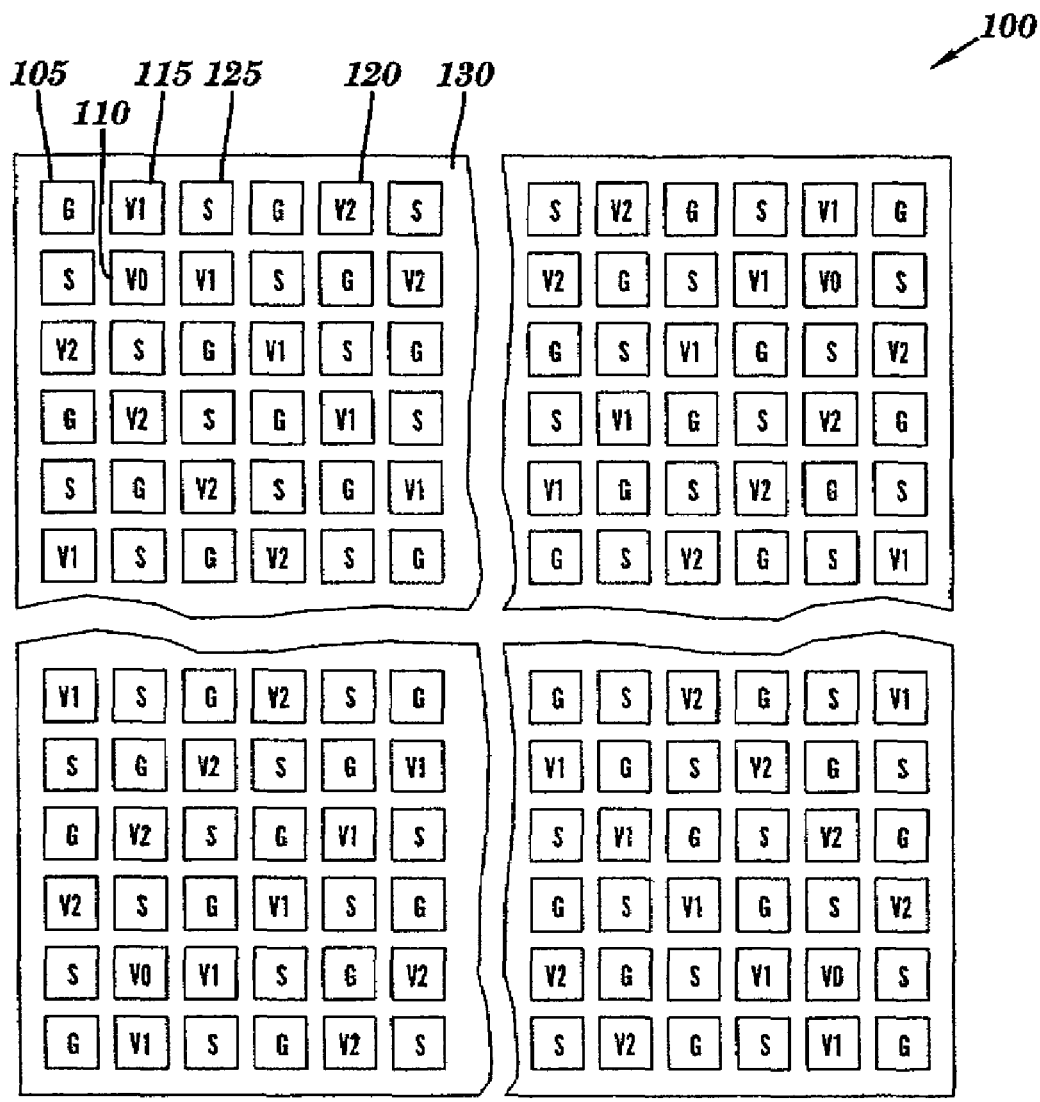
Figure 2:
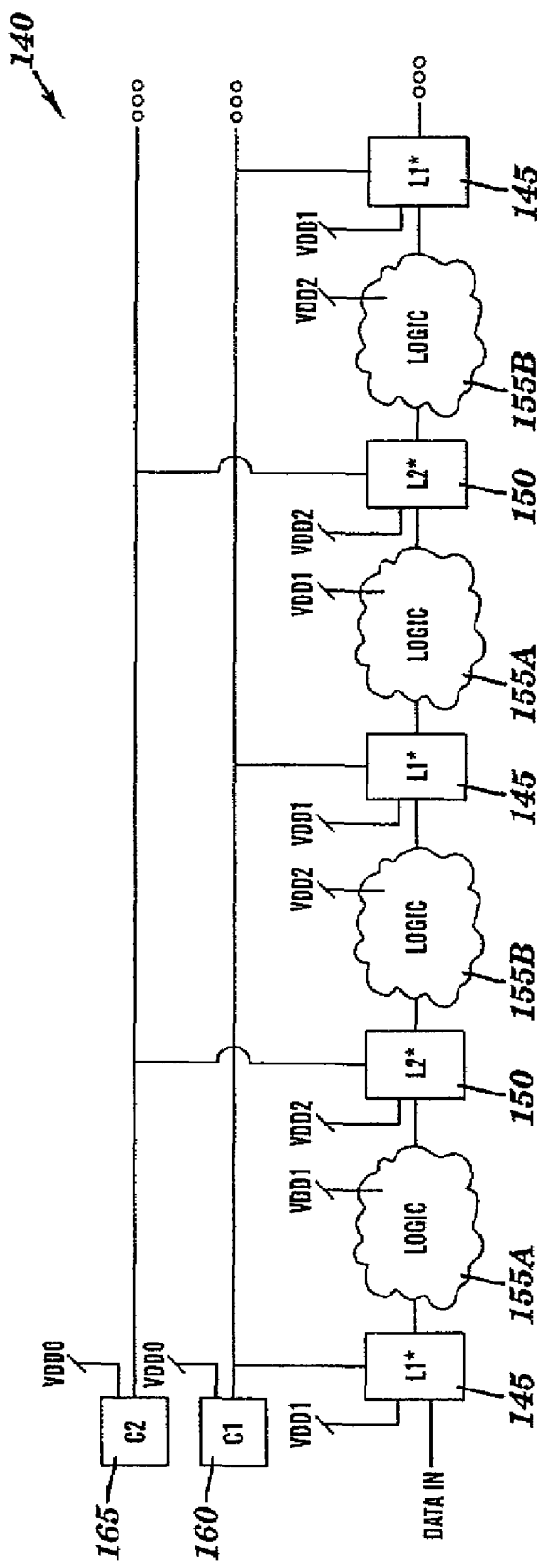
Figure 3:
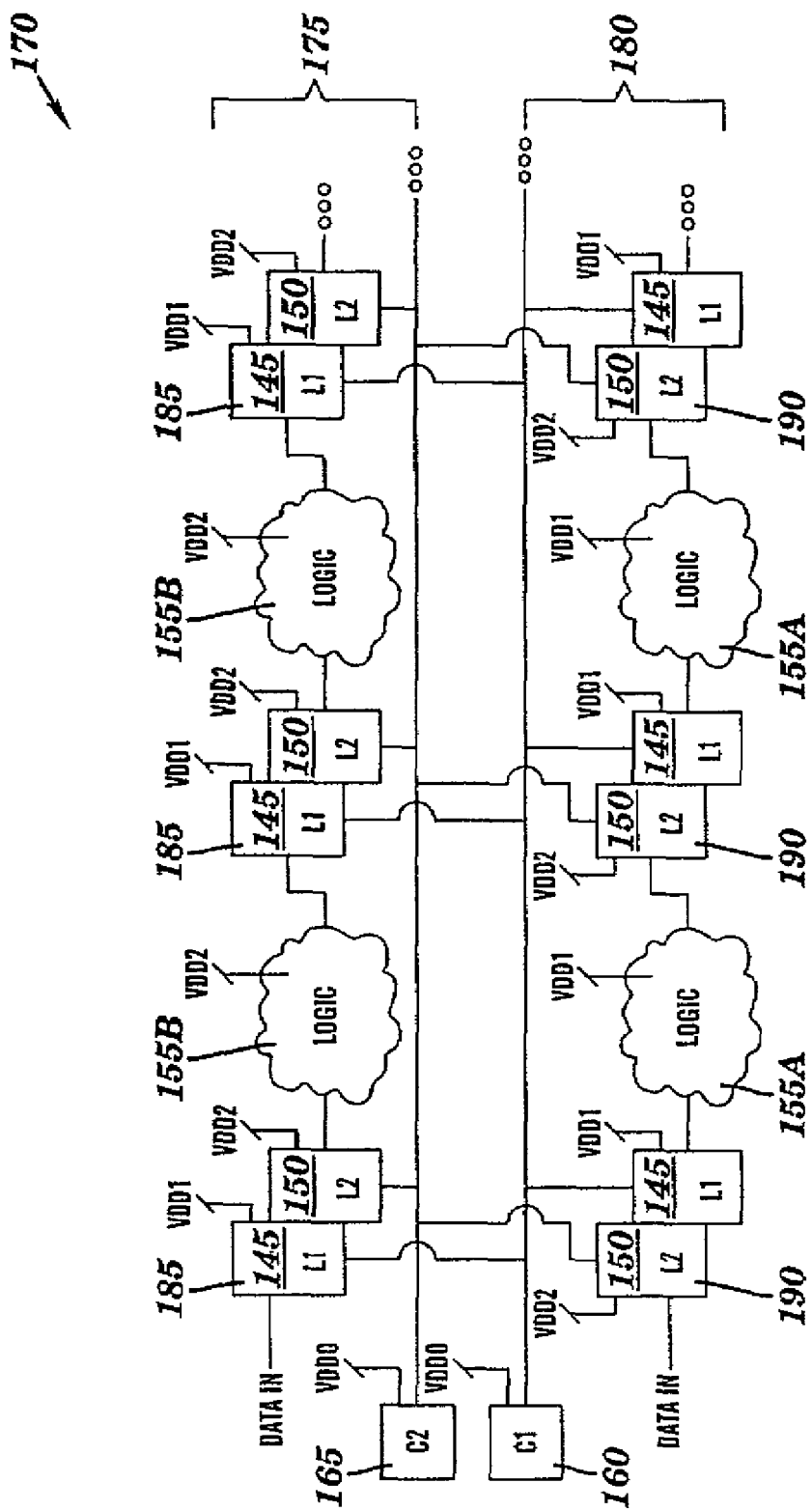
Figure 4:
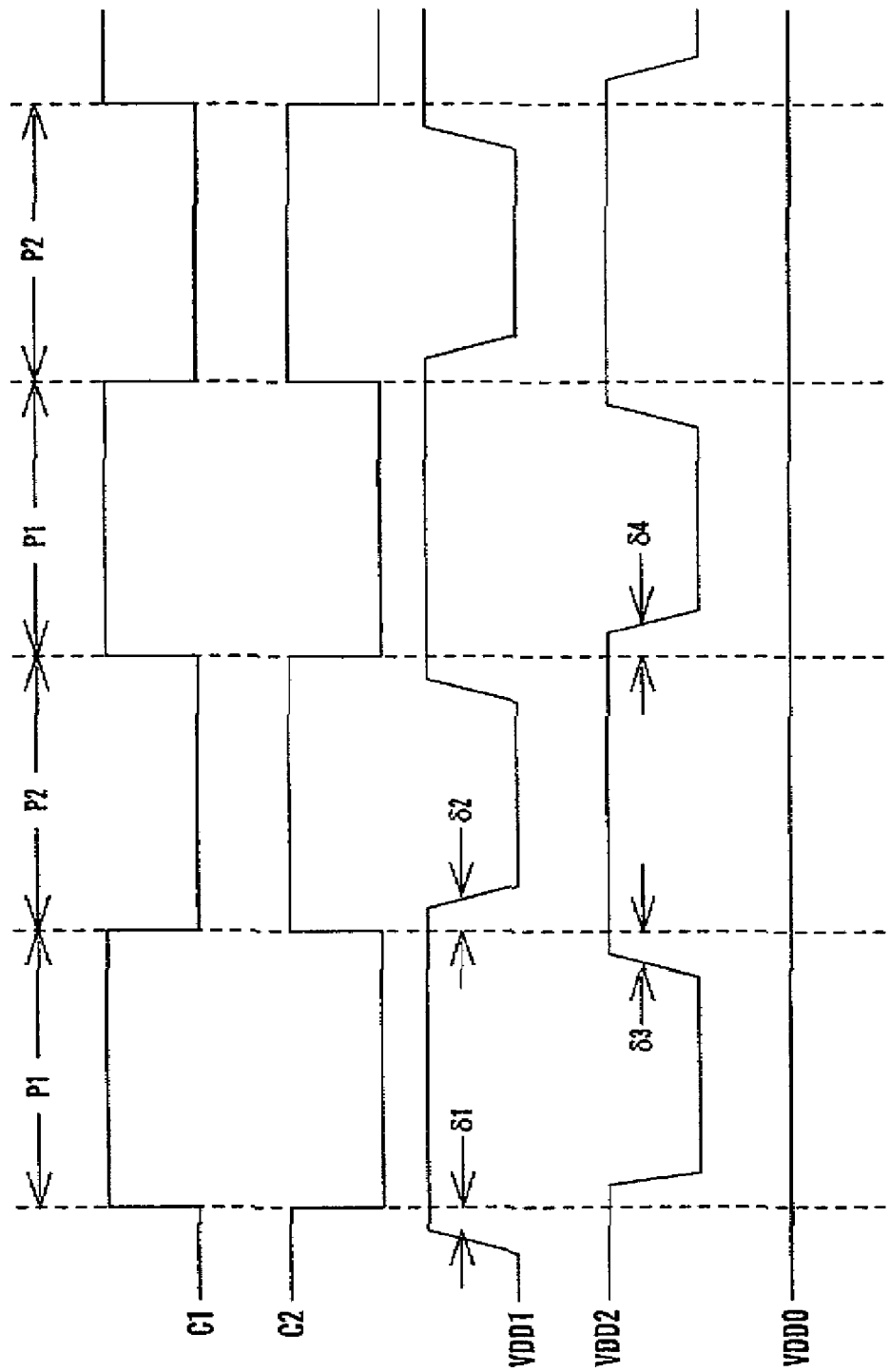
Figure 5:
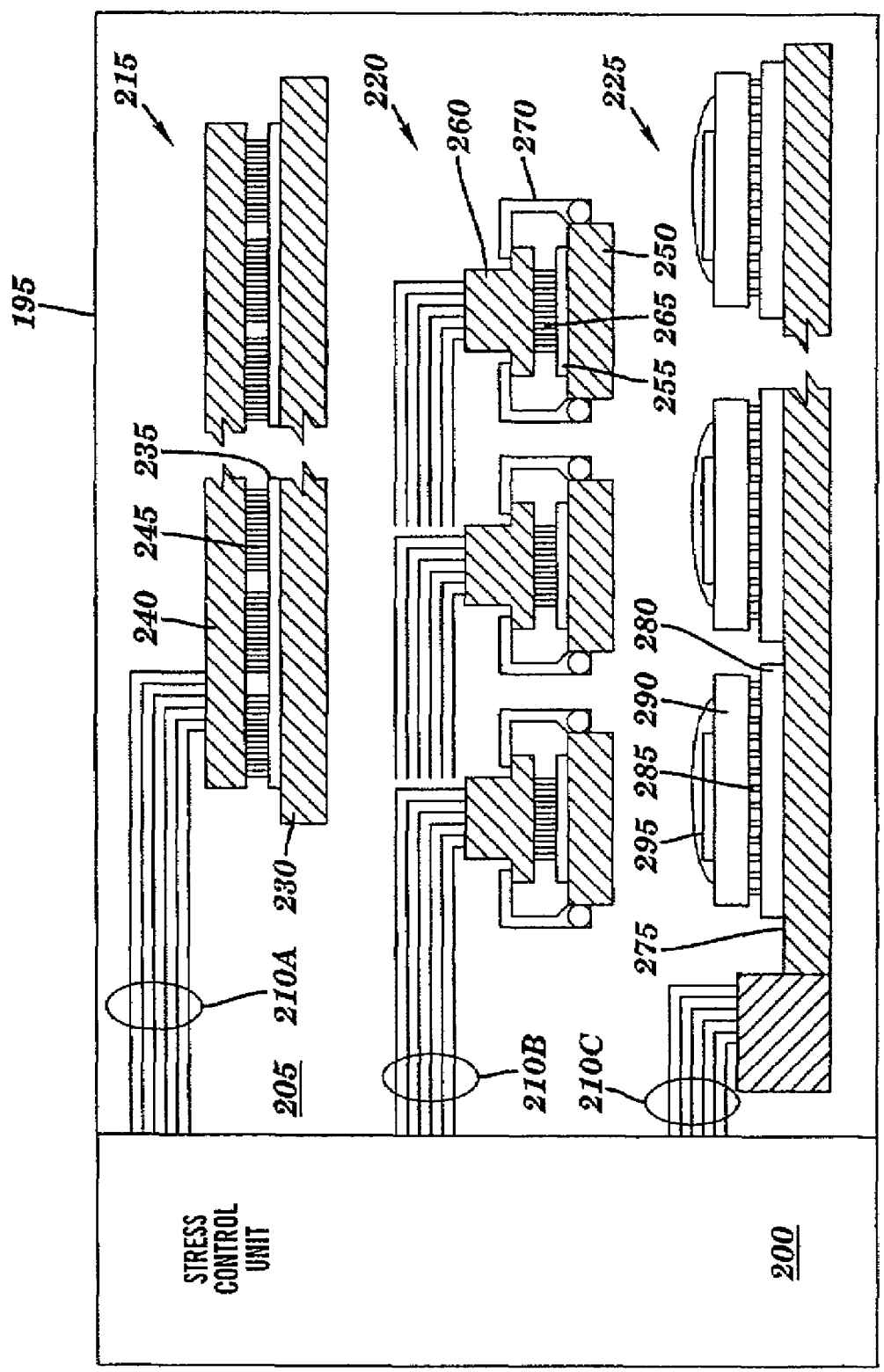
Figure 6:
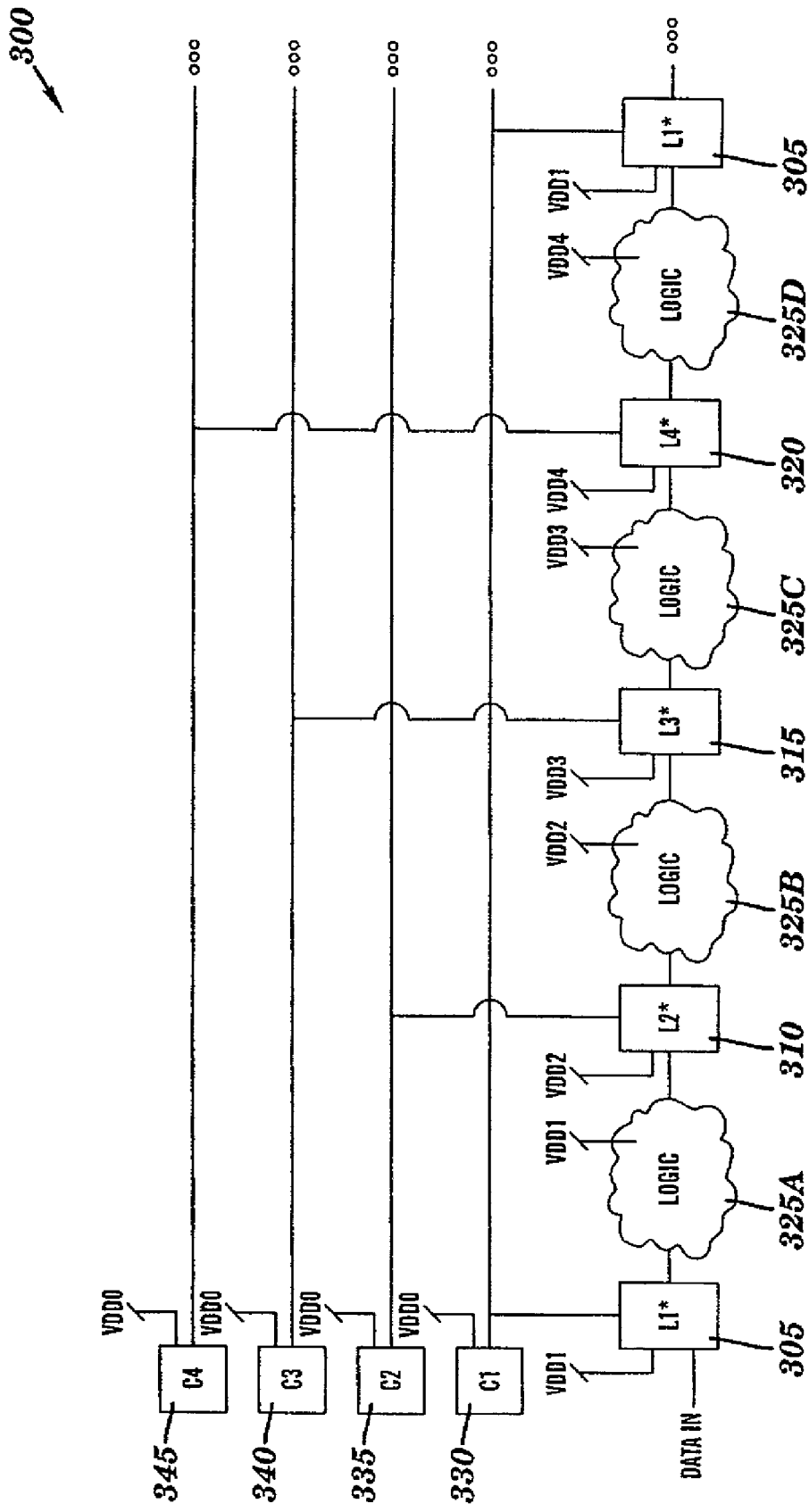
Figure 7:
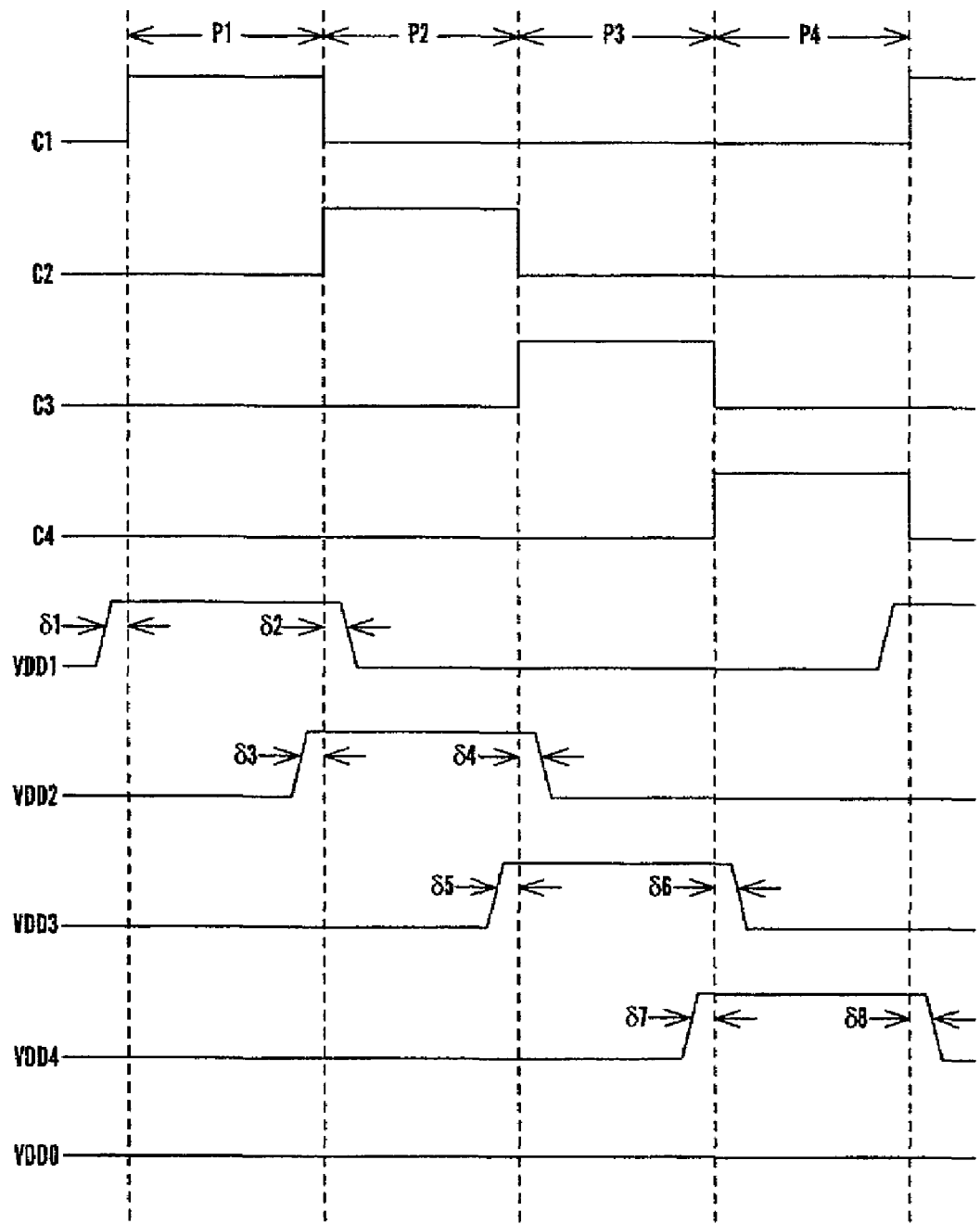

The features of the invention are set forth in the appended claims. The invention itself, however, will be best understood by reference to the following detailed description of illustrative embodiments when read in conjunction with the accompanying drawings, wherein:

FIG. 1 is a schematic diagram of an integrated circuit die illustrating pad assignments according to the present invention;

FIG. 2 is a schematic diagram of an integrated circuit device according to a first embodiment of the present invention;

FIG. 3 is a schematic diagram of an alternative latching arrangement of the integrated circuit device of the first embodiment of the present invention;

FIG. 4 is a timing diagram for clock and power signals for the integrated circuit device of the first embodiment of the present invention;

FIG. 5 is a schematic diagram illustrating a stress tester and alternative methods of stressing an integrated circuit device according to the present invention;

FIG. 6 is a schematic diagram of an integrated circuit device according to a second embodiment of the present invention; and FIG. 7 is a timing diagram for clock and power signals for the integrated circuit device of the second embodiment of the present invention.

DETAILED DESCRIPTION OF THE INVENTION

DETAILED DESCRIPTION OF THE INVENTION

FIG. 1 is a schematic diagram of an integrated circuit die illustrating pad assignments according to the present invention. In FIG. 1, integrated circuit die 100, comprises a multiplicity of ground pads 105, VDD0 pads 110, VDD1 pads 115, VDD2 pads 120 and signal pads 125 disposed on a top surface of the integrated circuit die. About 50% of the pads are signal pads 125, about 25% are ground pads 105 and the rest are distributed among VDD0 pads 110, VDD1 pads 115 and VDD2 pads 120. The number of VDD1 pads 115 and VDD2 pads 120 are approximately equal. The number of VDD0 pads 110 is very much smaller than the number of VDD1 pads 115 and VDD2 pads 120. The exact distribution of pads is a function of circuit power and signal requirements in integrated circuit die 100. The number of total pads may exceed 4000.

VDD0 pads 110 are used to supply power to clocks on integrated circuit die 100. VDD1 pads 115 are used to supply power to approximately one half of the latches on integrated circuit die 100 and VDD2 pads 120 are used to supply power to the remaining latches the integrated circuit die. During normal operation VDD0 pads 110, VDD1 pads 115 and VDD2 pads 120 may be supplied from the same external power supply, however during stress, the VDD0, VDD1 and VDD2 pads are supplied from different power supplies that are controlled by the stress tool. The voltages applied to VDD1 pads 115 and VDD2 pads 120 during the stress are generally higher than applied during normal operation of integrated circuit die 100 but are generally equal to each other. However, there may be circumstances that applying different voltages to VDD1 pads 115 and VDD2 pads may be useful.

As illustrated, the VDD pads of integrated circuit die 100 are shown for a two-phase embodiment of the present invention, that is, a two-clock system. In a four-phase embodiment, a four-clock system, there would also be pads for supplying VDD3 and VDD4 voltages, the number of pads supplying VDD1, VDD2, VDD3 and VDD4 being approximately equal to one another. The first embodiment of the present invention is to a two-clock system. The second embodiment of the present invention is to a four-clock system.

FIG. 2 is a schematic diagram of an integrated circuit device according to a first embodiment of the present invention. In FIG. 2, an integrated circuit device 140 comprises a series of alternating L1 latches 145 and L2 latches 150 interspersed with logic circuits 155A and 155B. Logic circuits 155A and 155B may comprise one or more logic gates arranged sequentially. Logic circuits 155A are coupled between the output of L1 latches 145 and the input of L2 latches 150. Logic circuits 155B are coupled between the output of L2 latches 150 and the input of L1 latches 145. Each L1 latch 145 is powered from a VDD1 power rail, as is each logic circuit 155A. Each L2 latch 150 is powered from a VDD2 power rail, as is each logic circuit 155B. Each of logic circuits 155A is not intended to be identical; (though they may be identical) they are merely powered from the same VDD1 power rail. Each of logic circuits 155B is not intended to be identical; (though they may be identical) they are merely powered from the same VDD2 power rail. Each L1 latch 145 is clocked by a C1 clock 160. Each L2 latch 150 is clocked by a C2 clock 165. Both C1 clock 160 and C2 clock 165 are powered from a VDD0 power rail.

During stress, when C1 clock 160 is high (1), C2 clock 165 is low (0), VDD1 is high, VDD2 is low, all L1 latches 145 are powered and all L2 latches 150 are de-powered. Data in logic circuits 155B is latched by L1 latches 145. Data in logic circuits 155A cannot be latched by L2 latches 150 since all the L2 latches are de-powered. Only L1 latches 145 and logic circuits 155A are drawing current when C1 clock 160 is high.

When C1 clock 160 is low, C2 clock 165 is low, VDD1 is low, VDD2 is high, all L1 latches 145 are de-powered and all L2 latches 150 are powered. Data in logic circuits 155A is latched by L2 latches 150. Data in logic circuits 155B cannot be latched by L1 latches 145 since all the L1 latches are de-powered. Only L2 latches 150 and logic circuits 155B are drawing current when C2 clock 165 is high. Therefore, half the current normally required for stressing a conventional logic circuit is required when integrated circuit device 140 is stressed.

There is a requirement of some overlap in VDD1 and VDD2 in order to gate data from and to L1 latches 145 and from and to L2 latches 150. This is illustrated in FIG. 4 and described below.

FIG. 3 is a schematic diagram of an alternative latching arrangement of the integrated circuit device of the first embodiment of the present invention. In FIG. 3, an integrated circuit device 170 comprises a first set of logic circuits 175 and a second set of logic circuits 180. First set of logic circuits 175 comprises a series of L1/L2 latches 185 alternating with logic circuits 155B. Each L1/L2 latch 185 comprises one L1 latch 145 directly feeding one L2 latch 150. For L1/L2 latches 185, L1 latch 145 is a master latch and L2 latch 150 is a slave latch. Logic circuits 155B are coupled between the output of each L2 150 latch and the input of each L1 latch 145. Second set of logic circuits 180 comprises a series of L2/L1 latches 190 alternating with logic circuits 155A. Each L2/L1 latch 190 comprises one L2 latch 150 directly feeding one L1 latch 145. For L2/L1 latches 190, L2 latch 150 is a master latch and L1 latch 145 is a slave latch. Logic circuits 155A are coupled between the output of each L1 latch 145 and the input of each L2 latch 150. Each L1 latch 145 is powered from a VDD1 power rail, as is each logic circuit 155A. Each L2 latch 150 is powered from a VDD2 power rail. Each L1 latch 145 is clocked by C1 clock 160. Each L2 latch 150 is clocked by C2 clock 165. Both C1 clock 160 and C2 clock 165 are powered from a VDD0 power rail.

During stress, when C1 clock 160 is high, C2 clock 165 is low, VDD1 is high, VDD2 is low, all L1 latches 145 are powered and all L2 latches 150 are de-powered. In first set of logic circuits 175, data in logic circuits 155B is latched by L1 latches 145. Data in L1 latches 145 cannot be latched by L2 latches 150 since all the L2 latches are de-powered. Only L1 latches 145 are drawing power. In second set of logic circuits 180, data in logic latches 150 is latched by L1 latches 145. Data in logic circuits 155A cannot be latched by L2 latches 150 since all the L2 latches are de-powered. Only L1 latches 145 and logic circuits 155A are drawing current.

When C1 clock 160 is low, C2 clock 165 is high, VDD1 is low, VDD2 is high, all L1 latches 145 are de-powered and all L2 latches 150 are powered. In first set of logic circuits 175, data in L1 latches 145 is latched by L2 latches 150. Data in logic circuits 155B cannot be latched by L1 latches 145 since all the L1 latches are de-powered. Only L2 latches 145 and logic circuits 155B are drawing power when C1 clock 160 is high. In second set of logic circuits 180, data in logic latches logic circuits 155A is latched by L2 latches 150. Data in logic L2 latches 150 cannot be latched by L1 latches 145 since all the L1 latches are de-powered. Only L2 latches 150 and logic circuits 155A are drawing current when C2 clock 165 is high. Therefore, half the current normally required for stressing a conventional logic circuit is required when integrated circuit device 170 is stressed.

Again, there is a requirement of some overlap in VDD1 and VDD2 in order to gate data from and to L1 latches 145 and from and to L2 latches 150. This is illustrated in FIG. 4 and described below.

FIG. 4 is a timing diagram for clock and power signals for the integrated circuit device of the first embodiment of the present invention. In FIG. 4, the relationship between the phases of the C1 and C2 clocks, VDD0 and the rise and fall of VDD1 and VDD2 is illustrated. C1 is high only during periods "P1." C2 is high only during periods "P2." C1 and C2 are never high in the same period and do not overlap. The duration of periods "P1" may equal "P2." In one example, the C1 and C2 clock frequencies are about five MHz. VDD0 is always high as it is the clock power supply. VDD1 rises "$t'_1$" before C1 goes high and falls "$t'_2$" after C1 goes low. VDD2 rises "$t'_3$" before C2 goes high and falls "$t'_4$" after C2 goes low "$t'_1$", "$t'_2$", "$t'_3$" and "$t'_4$" may be equal.

FIG. 5 is a schematic diagram illustrating a stress tester and alternative methods of stressing an integrated circuit device according to the present invention. In FIG. 5, stress tester 195 comprises a stress control unit 200 and a stress chamber 205. Stress control unit 200 is linked by a signal/power cable 210A to whole wafer stress fixture 215 or by a signal/power cable 210B to one or more die stress fixtures 220 or by a signal/power cable 210C to a module stress fixture 225.

Whole wafer stress fixture 215 comprises a wafer chuck 230 for holding an undiced integrated circuit wafer 235 and a test head 240 having a multiplicity of probes 245 for contacting pads on wafer 235.

Die stress fixtures 220 comprise a die holder 250 for holding an integrated circuit die 255, a test head 260 having a multiplicity of probes 265 for contacting pads on integrated circuit die 255 and locking mechanisms 270 for holding test head 260 in place.

Module stress fixture 225 comprises a stress board 275 having a multiplicity of sockets 280. Sockets 280 are adapted to receive pins 285 of modules 290. Each module 290 contains one or more integrated circuit dies 295.

C1, C2, VDD0, VDD1, VDD2 (also C3, C4, VDD3 and VDD4 of the second embodiment illustrated in FIGS. 6 and 7 and described below) as well as any data signals are controlled by stress control unit 200. Stress chamber 205 is capable of temperature and humidity control. In one example, VDD1, VDD2, VDD3 and VDD4 are 1.5 times the normal operational voltage of the integrated circuit wafer, die or module being stressed and the temperature is controlled to either 140° C. or 180° C.

FIG. 6 is a schematic diagram of an integrated circuit device according to a second embodiment of the present invention. In FIG. 6, an integrated circuit device 300 comprises a series of alternating L1 latches 305, L2 latches 310, L3 latches 315 and L4 latches 320 interspersed with logic circuits 325A, 325B, 325C and 325D. Logic circuits 325A are coupled between the output of each L1 latch 305 and the input of each L2 latch 310. Logic circuits 325B are coupled between the output of each L2 latch 310 and the input of each L3 latch 315. Logic circuits 325C are coupled between the output of each L3 latch 315 and the input of each L4 latch 320. Logic circuits 325D are coupled between the output of each L4 latch 320 and the input of each L1 latch 305. Each L1 latch 305 is powered from a VDD1 power rail, as is each logic circuit 325A. Each L2 latch 310 is powered from a VDD2 power rail, as is each logic circuit 325B. Each L3 latch 315 is powered from a VDD3 power rail, as is each logic circuit 325C. Each L4 latch 320 is powered from a VDD4 power rail, as is each logic circuit 325D. Each of logic circuits 325A is not intended to be identical; (though they may be identical) they are merely powered from the same VDD1 power rail. Each of logic circuits 325B is not intended to be identical; (though they may be identical) they are merely powered from the same VDD1 power rail. Each of logic circuits 325C is not intended to be identical (though they may be identical); they are merely powered from the same VDD3 power rail. Each of logic circuits 325D is not intended to be identical; (though they may be identical) they are merely powered from the same VDD4 power rail. Each L1 latch 305 is clocked by a C1 clock 330. Each L2 latch 310 is clocked by a C2 clock 335. Each L3 latch 315 is clocked by a C3 clock 340. Each L4 latch 320 is clocked by a C4 clock 340. C1 clock 330, C2 clock 335, C3 clock 340 and C4 clock 345 are powered from a VDD0 power rail.

During stress, when C1 clock 330 is high, C2 clock 335, C3 clock 340 and C4 clock 345 are low, VDD1 is high, VDD2, VDD3 and VDD4 are off, all L1 latches 305 are powered and all L2 latches 310, L3 latches 315 and L4 latches 320 are de-powered. Data in logic circuits 325D is latched by L1 latches 305. Data in logic circuits 325A, logic circuits 325B and logic circuits 325C cannot be latched by L2 latches 310, L3 latches 315 and L4 latches 320 respectively, since only the L1 latches are powered. Only L1 latches 305 and logic circuits 325A are drawing current when C1 clock 330 is high.

When C2 clock 335 is high, C1 clock 330, C3 clock 340 and C4 clock 345 are off, VDD2 is high, VDD1, VDD3 and VDD4 are off, all L2 latches 310 are powered and all L1 latches 305, L3 latches 315 and L4 latches 320 are de-powered. Data in logic circuits 325A is latched by L2 latches 310. Data in logic circuits 325B, logic circuits 325C and logic circuits 325D cannot be latched by L3 latches 315, L4 latches 320 and L1 latches 305 respectively, since only the L2 latches are powered. Only L2 latches 310 and logic circuits 325B are drawing current when C2 clock 335 is high.

When C3 clock 340 is high, C1 clock 330, C2 clock 335 and C4 clock 345 are off, VDD3 is high, VDD1, VDD2 and VDD4 are off, all L3 latches 315 are powered and all L1 latches 305, L2 latches 310 and L4 latches 320 are de-powered. Data in logic circuits 325B is latched by L3 latches 315. Data in logic circuits 325D, logic circuits 325A and logic circuits 325C cannot be latched by L1 latches 305, L2 latches 310 and L4 latches 320 respectively, since only the L3 latches are powered. Only L3 latches 315 and logic circuits 325C are drawing current when C3 clock 340 is high.

When C4 clock 345 is high, C1 clock 330, C2 clock 335 and C3 clock 340 are off, VDD4 is high, VDD1, VDD2 and VDD3 are off, all L4 latches 320 are powered and all L1 latches 305, L2 latches 310 and L3 latches 315 are de-powered. Data in logic circuits 325C is latched by L4 latches 320. Data in logic circuits 325D, logic circuits 325A and logic circuits 325B cannot be latched by L1 latches 305, L2 latches 310 and L3 latches 315 respectively, since only the L4 latches are powered. Only L4 latches 320 and logic circuits 325D are drawing current when C4 clock 345 is high. Therefore, a quarter of the current normally required for stressing a conventional logic circuit is required when integrated circuit device 300 is stressed.

There is a requirement of some overlap of VDD1 and VDD2 and of VDD3 and VDD4 in order to gate data from and to L1 latches 305 and L2 latches 310 and from and to L3 latches 315 and L4 latches 320 respectively. This is illustrated in FIG. 7 and described below.

FIG. 7 is a timing diagram for clock and power signals for the integrated circuit device of the second embodiment of the present invention. FIG. 7 shows the relationship between the phases of the C1, C2, C3 and C4 clocks, VDD0 and the rise and fall of VDD1, VDD2, VDD3 and VDD4. C1 is high only during periods "P1." C2 is high only during periods "P2." C3 is high only during periods "P3." C4 is high only during periods "P4." C1, C2, C3 and C4 are never high in the same period and do not overlap. The duration of time periods "P1", "P2", "P4" and "P2" may be equal to each other. In one example, the C1, C2, C3 and C2 clock frequencies are about five MHz. VDD0 is always high as it is the clock power supply. VDD1 rises "$\hat{t}'_1$" before C1 goes high and falls "$\hat{t}'_2$" after C1 goes low. VDD2 rises "$\hat{t}'_3$" before C2 goes high and falls "$\hat{t}'_4$" after C2 goes low. VDD3 rises "$\hat{t}'_5$" before C3 goes high and falls "$\hat{t}'_6$" after C3 goes low. VDD4 rises "$\hat{t}'_7$" before C4 goes high and falls "$\hat{t}'_8$" after C4 goes low. "$\hat{t}'_1$", "$\hat{t}'_2$", "$\hat{t}'_3$" "$\hat{t}'_4$", "$\hat{t}'_5$", "$\hat{t}'_6$", "$\hat{t}'_7$" and "$\hat{t}'_8$" may be equal.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. An integrated circuit for performing stress testing, comprising:
    a first power rail connected to a first latch and a first circuit, said first power rail powered when a first clock signal is in an (A) state and de-powered when said first clock signal is in a (1−A) state where A is equal to 0 or 1, said first power rail supplied from a first power supply;
    a second power rail connected to a second latch, said second power rail powered when a second clock signal is in a (B) state and de-powered when said second clock signal is in a (1−B) state, where B is equal to 0 or 1, said second power rail supplied from a second power supply;
    said first circuit coupled between an output of said first latch and an input of said second latch; and
    said first clock signal high whenever said second clock signal is low, said first clock signal low whenever said second clock signal is high, low states of said first clock signal not overlapping high states of said second clock signal and low states of said second clock signal not overlapping high states of said first clock signal.

2. The integrated circuit of claim 1, further comprising a second circuit coupled to an output of said second latch and powered from said second rail.

3. The integrated circuit of claim 1, wherein said first clock signal is supplied from a first clock and said second clock signal is supplied from a second clock, said first and second clocks powered from a third power rail, said third power rail supplied from a third power supply.

4. The integrated circuit of claim 1, wherein:
said first power rail is powered before said first clock signal goes high and is de-powered after said first clock signal goes low; and
said second power rail is powered before said second clock signal goes high and is de-powered after second first clock signal goes low.

5. The integrated circuit of claim 1, wherein:
said first power rail is powered when said first clock signal is high and is de-powered when said first clock signal is low and said second power rail is powered when said second clock signal is high and is de-powered when said second clock signal is low; or
said first power rail is powered when said first clock signal is low and is de-powered when said first clock signal is high and said second power rail is powered when said second clock signal is low and is de-powered when said second clock signal is high.

6. An integrated circuit for performing stress testing, comprising:
a first power rail connected to an L1 latch of a first L1/L2 latch, to a first circuit and to an L1 latch of a second L1/L2 latch, said first power rail powered when a first clock signal is in an (A) state and de-powered when said first clock signal is in a (1–A) state whore A is equal to 0 or 1, said first power rail supplied from a first power supply;
a second power rail connected to an L2 latch of said first L1/L2 latch and to an L2 latch of said second L1/L2 latch, said second power rail powered when a second clock signal is in a (B) state and de-powered when said second clock signal is in a (1–B) state where B is equal to 0 or 1, said second power rail supplied from a second power supply; and
said first clock signal high whenever said second clock signal is low, said first clock signal low whenever said second clock signal is high, low states of said first clock signal not overlapping high states of said second clock signal and low states of said second clock signal not overlapping high states of said first clock signal.

7. The integrated circuit of claim 6, wherein said first clock signal is supplied from a first clock and said second clock signal is supplied from a second clock, said first and second clocks powered from a third power rail, said third power rail supplied from a third power supply.

8. The integrated circuit of claim 6, wherein:
said first power rail is powered before said first clock signal goes high and is de-powered after said first clock signal goes low; and
said second power rail is powered before said second clock signal goes high and is de-powered after second first clock signal goes low.

9. The integrated circuit of claim 6, wherein:
said first power rail is powered when said first clock signal is high and de-powered when said first clock signal is low and said second power rail is powered when said second clock signal is high and de-powered when said second clock signal is low; or
said first power rail is powered when said first clock signal is low and is de-powered when said first clock signal is high and said second power rail is powered when said second clock signal is low and is de-powered when said second clock signal is high.

10. An integrated circuit for performing stress testing comprising:
a first power rail connected to a first latch and a first circuit, said first power rail powered when a first clock signal is in an (A) state and de-powered when said first clock signal is in a (1–A) state where A is equal to 0 or 1, said first power rail supplied from a first power supply;
a second power rail connected to a second latch and a second circuit, said power rail powered when a second clock signal is in a (B) state and de-powered when said second clock signal is in a (1–B) state where B is equal to 0 or 1, said second power rail supplied from a second power supply;
a third power rail connected to a third latch and a third circuit, said third power rail powered when a third clock signal is in a (C) state and de-powered when said third clock signal is in a (1–C) state where C is equal to 0 or 1, said third power rail supplied from a third power supply;
a fourth power rail connected to a fourth latch and a fourth circuit, said fourth power rail powered when a fourth clock signal is in a (D) state and de-powered when said fourth clock signal is in a (1–D) state where D is equal to 0 or 1, said fourth power rail supplied from a fourth power supply;
said first circuit coupled between an output of said first latch and an input or said second latch, said second circuit coupled between an output of said second latch and an input of said third latch, said third circuit coupled between an output of said third latch and an input of said fourth latch and said fourth circuit coupled to an output of said fourth latch; and
either said first clock signal high whenever said second, third and fourth clocks are all low, said second clock signal high whenever said first, third and fourth clocks are all low, said third clock signal high whenever said first, second and fourth clocks are all low and said fourth clock signal high whenever said first, second and third clocks are all low or said first clock signal low whenever said second, third and fourth clocks arc all high, said second clock signal low whenever said first, third and fourth clocks are all high, said third clock signal low whenever said first, second and fourth clocks are all high and said fourth clock signal low whenever said first, second and third clocks are all high, low states of said first clock signal not overlapping high states of said second clock signal and low stales of said second clock signal not overlapping high states of said first clock signal.

11. The integrated circuit of claim 10, further comprising a fifth latch powered from said first power rail, said fourth circuit coupled to an input of said fifth latch.

12. The integrated circuit of claim 10, wherein said first clock signal is supplied from a first clock, said second clock signal is supplied from a second clock, said third clock signal is supplied from a third clock and said fourth clock signal is supplied from a fourth clock, said first, second, third and fourth clocks powered from a fifth power rail, said fifth power rail supplied from a fifth power supply.

13. The integrated circuit of claim 10, wherein:
said first power rail is powered before said first clock signal goes high and is de-powered after said first clock signal goes low;

said second power rail is powered before said second clock signal goes high and is de-powered after second first clock signal goes low;

said third power rail is powered before said third clock signal goes high and is de-powered after said third clock signal goes low; and said fourth power rail is powered before said fourth clock signal goes high and is de-powered after second first clock signal goes low.

14. The integrated circuit of claim 10, wherein said second clock phase goes high when said first clock phase goes low, said third clock phase goes high when said second clock phase goes low, said fourth clock phase goes high when said third clock phase goes low and said first clock phase goes high when said fourth clock phase goes low.

15. The integrated circuit of claim 10, wherein:

said first power rail is powered when said first clock signal is high and is de-powered when said first clock signal is low, said second power rail is powered when said second clock signal is high and is de-powered when said second clock signal is low, said third power rail is powered when said third clock signal is high and is de-powered when said third clock signal is low, and said fourth power rail is powered when said fourth clock signal is high and is de-powered when said fourth clock signal is low; or said first power rail is powered when said first clock signal is low and is de-powered when said first clock signal is high and said second power rail is powered when said second clock signal is low and is de-powered when said second clock signal is high, said third power rail is powered when said third clock signal is low and is de-powered when said third clock signal is high and said fourth power rail is powered when said fourth clock signal is low and is de-powered when said fourth clock signal is high.

16. A method for stress testing an integrated circuit, comprising:

providing said integrated circuit, said integrated circuit including:

a first power rail connected to a first latch and a circuit, said first power rail supplied from a first power supply; and a second power rail connected to a second latch, said second power rail supplied from a second power supply, said circuit coupled between an output of said first latch and an input of said second latch;

powering said first power rail when a first clock signal is in an (A) state and de-powering said first power rail when said first clock signal is in a (1−A) state where A is equal to 0 or 1; and powering said second power tail when a second clock signal is in a (B) state and de-powering said second power rail when said second clock signal is in a (1−B) state where B is equal to 0 or 1, said first clock signal high whenever said second clock signal is low, said first clock signal low whenever said second clock signal is high, low states of said first clock signal not overlapping high states of said second clock signal and low states of said second clock signal not overlapping high states of said first clock signal.

17. The method of claim 16, further comprising a second circuit coupled to an output of said second latch and powered from said second rail.

18. The method of claim 16, wherein:

said first clock signal is supplied from a first clock and said second clock signal is supplied from a second clock; and powering said first and second clocks from a third power rail, said third power rail supplied from a third power supply.

19. The method of claim 16, further including:

powering said first power rail before said first clock signal goes high and de-powering said first power rail after said first clock signal goes low; and powering said second power rail before said second clock signal goes high and de-powering said second power rail after second clock goes low.

20. The method of claim 16, wherein:

said first power rail is powered when said first clock signal is high and is de-powered when said first clock signal is low and said second power rail is powered when said second clock signal is high and is de-powered when said second clock signal is low; or said first power rail is powered when said first clock signal is low and is de-powered when said first clock signal is high and said second power rail is powered when said second clock signal is low and is de-powered when said second clock signal is high.

21. A method for stress testing an integrated circuit comprising:

providing said integrated circuit said integrated circuit including:

a first power rail connected to an L1 latch of a first L1/L2 latch, to a first circuit and to an L1 latch of a second L1/L2 latch, said first power rail supplied from a first power supply; and a second power rail connected to an L2 latch of said first L1/L2 latch and to an L2 latch of said second L1/L2 latch, said second power rail supplied front a second power supply;

powering said first power rail when a first clock signal is in an (A) state and de-powering said first power rail when said first clock signal is in a (1−A) state where A is equal to 0 or 1; and powering said second power rail when a second clock signal is in a (B) state and de-powering said second power rail when said second clock signal is in a (1−B) state where B is equal to 0 or 1, said first clock signal high whenever said second clock signal is low, said first clock signal low whenever said second clock signal is high, low states of said first clock signal not overlapping high states of said second clock signal and low states of said second clock signal not overlapping high states of said first clock signal.

22. The method of claim 21, further including:

powering said first power rail before said first clock signal goes high and de-powering said first power rail after said first clock signal goes low; and powering said second power rail before said second clock signal goes high and de-powering said second power rail after second first clock signal goes low.

23. The method of claim 21, wherein:

said first power rail is powered when said first clock signal is high and is de-powered when said first clock signal is low and said second power rail is powered when said second clock signal is high and is de-powered when said second clock signal is low; or said first power rail is powered when said first clock signal is low and is de-powered when said first clock signal is high and said second power rail is powered when said second clock signal is low and is de-powered when said second clock signal is high.

24. A method for stress testing an integrated circuit comprising:
 providing said integrated circuit, said integrated circuit comprising:
  a first power rail connected to a first latch and a first circuit, said first power rail supplied front a first power supply;
  a second power rail connected to a second latch and a second circuit, said second power rail supplied from a second power supply;
  a third power rail connected to a third latch and a third circuit, said third power rail supplied from a third power supply;
  a fourth power rail connected to a fourth latch and a fourth circuit, said fourth power rail supplied from a fourth power supply; and
  said first circuit coupled between an output of said first latch and an input of said second latch, said second circuit coupled between an output of said second latch and an input of said third latch, said third circuit coupled between an output of said third latch and an input of said fourth latch and said fourth circuit coupled to an output of said fourth latch; and
 powering said first power rail when a first clock signal is in an (A) state and de-powering said first power rail when said first clock signal is in a (1−A) state where A is equal to 0 or 1;
 powering said second power rail powered when a second clock signal is in a (B) state and de-powering said second power rail when said second clock signal is in a (1−B) state where B is equal to 0 or 1;
 powering said third power rail powered when a third clock signal is in a (C) state and de-powering said third power rail when said third clock signal is in a (1−C) state where C is equal to 0 or 1;
 powering said fourth power rail powered when a fourth clock signal is in a (D) state and de-powering said fourth power rail when said fourth clock signal is in a (1−D) state where D is equal to 0 or 1; and
 either said first clock signal high whenever said second, third and fourth clocks are all low, said second clock signal high whenever said first, third and fourth clocks are all low, said third clock signal high whenever said first, second and fourth clocks are all low and said fourth clock signal high whenever said first, second and third clocks are all low or said first clock signal low whenever said second, third and fourth clocks are all high, said second clock signal low whenever said first, third and fourth clocks are all high, said third clock signal low whenever said first, second and fourth clocks are all high and said fourth clock signal low whenever said first, second and third clocks are all high, low states of said first clock signal not overlapping high states or said second clock signal and low states of said second clock signal not overlapping high states of said first clock signal.

25. The method of claim 24, said integrated circuit further comprising a fifth latch powered from said first power rail, said fourth circuit coupled to an input of said fifth latch.

26. The method of claim 24, wherein:
 said first clock signal is supplied from a first clock, said second clock signal is supplied from a second clock, said third clock signal is supplied from a third clock and said fourth clock signal is supplied from a fourth clock; and
 powering said first, second, third and fourth clocks from a fifth power rail, said fifth power rail supplied from a fifth power supply.

27. The method of claim 24, further including:
 powering said first power rail before said first clock signal goes high and de-powering said first power rail after said first clock signal goes low;
 powering said second power rail before said first clock signal goes high and de-powering said second power rail after said first clock signal goes low;
 powering said third power rail before said first clock signal goes high and de-powering said third power rail after said first clock signal goes low; and
 powering said fourth power rail before said first clock signal goes high and de-powering said fourth power rail after said first clock signal goes low.

28. The method of claim 24, wherein said second clock signal goes high when said first clock signal goes low, said third clock signal goes high when said second clock signal goes low, said fourth clock signal goes high when said third clock signal goes low and said first clock signal goes high when said fourth clock signal goes low.

29. The method of claim 24, wherein:
 said first power rail is powered when said first clock signal is high and is de-powered when said first clock signal is low, said second power rail is powered when said second clock signal is high and is de-powered when said second clock signal is low, said third power rail is powered when said third clock signal is high and is de-powered when said third clock signal is low, and said fourth power rail is powered when said fourth clock signal is high and is de-powered when said fourth clock signal is low; or
 said first power rail is powered when said first clock signal is low and is de-powered when said first clock signal is high and said second power rail is powered when said second clock signal is low and is de-powered when said second clock signal is high, said third power rail is powered when said third clock signal is low and is de-powered when said third clock signal is high and said fourth power rail is powered when said fourth clock signal is low and is de-powered when said fourth clock signal is high.

* * * * *

UNITED STATES PATENT AND TRADEMARK OFFICE
CERTIFICATE OF CORRECTION

| | | |
|---|---|---|
| PATENT NO. | : 7,000,162 B2 | |
| APPLICATION NO. | : 09/682233 | |
| DATED | : February 14, 2006 | |
| INVENTOR(S) | : Bernstein et al. | |

It is certified that error appears in the above-identified patent and that said Letters Patent is hereby corrected as shown below:

Please add the entire "in col. 1, line 43 "Summary of the Invention" as indicated on page 2 of 2. It was omitted in the Letters Patent.

Column 7
Line 30, delete "whore" and insert -- where --

Column 8
Line 44, delete "arc" and insert -- are --

Column 9
Line 54, delete "tail" and insert -- rail --

Column 10
Line 36, delete "front" and insert -- from --

Column 11
Line 56, delete "or" and insert -- of --

SUMMARY OF THE INVENTION

A first aspect of the present invention is an integrated circuit device, comprising: a first power rail for supplying power to a first latch and a circuit during a first clock phase; a second power rail for supplying power to a second latch during a second clock phase; and the circuit coupled between an output of the first latch and an input of the second latch.

A second aspect of the present invention is an integrated circuit device, comprising: a first power rail for supplying power to an L1 latch of an L1/L2 latch during a first clock phase; and a second power rail for supplying power to an L2 latch of the L1/L2 latch and to a circuit coupled to an output of the L2 latch during a second clock phase.

A third aspect of the present invention is an integrated circuit device, comprising: a first power rail for supply power to first latch and a first circuit during a first clock phase; a second power rail for supplying power to a second latch and a second circuit during a second clock phase; a third power rail for supplying power to a third latch and a third circuit during a third clock phase; a fourth power rail for supply power to fourth latch and a fourth circuit during a fourth clock phase; and the first circuit coupled between an output of the first latch and an input of the second latch, the second circuit coupled between an output of the second latch and an input of the third latch, the third circuit coupled between an output of the third latch and an input of the fourth latch and the fourth circuit coupled to an output of the fourth latch.

UNITED STATES PATENT AND TRADEMARK OFFICE
CERTIFICATE OF CORRECTION

PATENT NO. : 7,000,162 B2
APPLICATION NO. : 09/682233
DATED : February 14, 2006
INVENTOR(S) : Bernstein et al.

It is certified that error appears in the above-identified patent and that said Letters Patent is hereby corrected as shown below:

A fourth aspect of the present invention is a method of stressing an integrated circuit device, the integrated circuit device including a first power rail for supplying power to first latch and a circuit, a second power rail for supplying power to a second latch, and the circuit coupled between an output of the first latch and an input of the second latch, comprising: powering the power rail during each phase of a first clock; and powering the second power rail phase of a second clock.

A fifth aspect of the present invention is a method of stressing an integrated circuit device, the integrated circuit device including a first power rail for supplying power to an L1 latch of an L1/L2 latch; and a second power rail for supplying power to an L2 latch of the L1/L2 latch and to a circuit coupled to an output of the L2 latch, comprising:powering the first power rail during each phase of a first clock; and powering the second power rail during each phase of a second clock.

A sixth aspect of the present invention is a method of stressing an integrated circuit device, the integrated circuit device including a first power rail for supply power to first latch and first circuit, a second power rail for supplying power to a second latch and a second circuit, a third power rail for supplying power to a third latch and a third circuit, a fourth power rail for supply power to fourth latch and a fourth circuit, and the first circuit coupled between an output of the first latch and an input of the second latch, the second circuit coupled between an output of the second latch and an input of the third latch, the third circuit coupled between an output of the third latch and an input of the fourth latch and the fourth circuit coupled to an output of the fourth latch, comprising: powering the first power rail during each phase of a first clock; powering the second power rail during each phase of a second clock; powering the third power rail during each phase of a third clock; and powering the fourth rail during each phase of fourth clock.

Signed and Sealed this

Twenty-second Day of August, 2006

JON W. DUDAS
*Director of the United States Patent and Trademark Office*